(12) United States Patent
Kim

(10) Patent No.: US 6,744,090 B2
(45) Date of Patent: Jun. 1, 2004

(54) DAMASCENE CAPACITOR FORMED IN METAL INTERCONNECTION LAYER

(75) Inventor: Si-Bum Kim, Ichon-shi (JP)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/260,624

(22) Filed: Oct. 1, 2002

(65) Prior Publication Data

US 2003/0098484 A1 May 29, 2003

(30) Foreign Application Priority Data

Nov. 27, 2001 (KR) .......................... 2001-74336

(51) Int. Cl.⁷ .............................................. H01L 29/76
(52) U.S. Cl. ........................ 257/301; 257/296; 257/288; 257/304; 257/305; 438/386
(58) Field of Search .................. 257/301, 296, 257/288, 304, 305, E21.396, E27.092, E29.346; 438/386

(56) References Cited

U.S. PATENT DOCUMENTS

| 6,054,172 A | 4/2000 | Robinson et al. |
| 6,054,173 A | 4/2000 | Robinson et al. |
| 6,102,993 A | 8/2000 | Bhandari et al. |
| 6,126,989 A | 10/2000 | Robinson et al. |
| 6,159,787 A | * 12/2000 | Aitken et al. ............... 438/243 |
| 6,211,035 B1 | 4/2001 | Moise et al. |
| 6,297,155 B1 | 10/2001 | Simpson et al. |
| 6,326,303 B1 | 12/2001 | Robinson et al. |

FOREIGN PATENT DOCUMENTS

EP          1020905 A1   7/2000    ......... H01L/21/768

* cited by examiner

Primary Examiner—Nathan J. Flynn
Assistant Examiner—Scott R Wilson
(74) Attorney, Agent, or Firm—Jacobson Holman PLLC

(57) ABSTRACT

A method for fabricating a semiconductor device that forms a capacitor and metal interconnection in the same level, simultaneously using a damascene process for forming a metal interconnection. A capacitor structure having the high capacitance needed for logic elements is obtained without increasing the number of layers for fabricating the capacitor by forming a three-dimensional capacitor in the damascene pattern while maintaining the conventional processes in a damascene interconnection process.

15 Claims, 9 Drawing Sheets

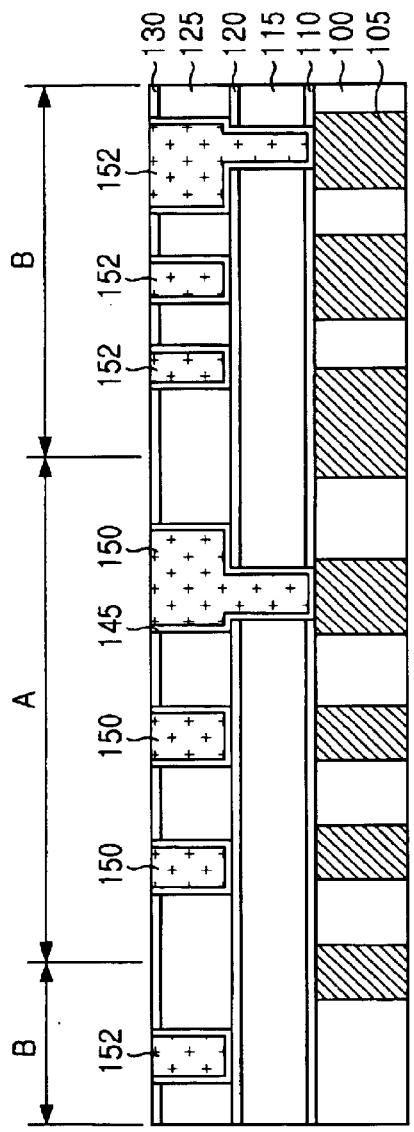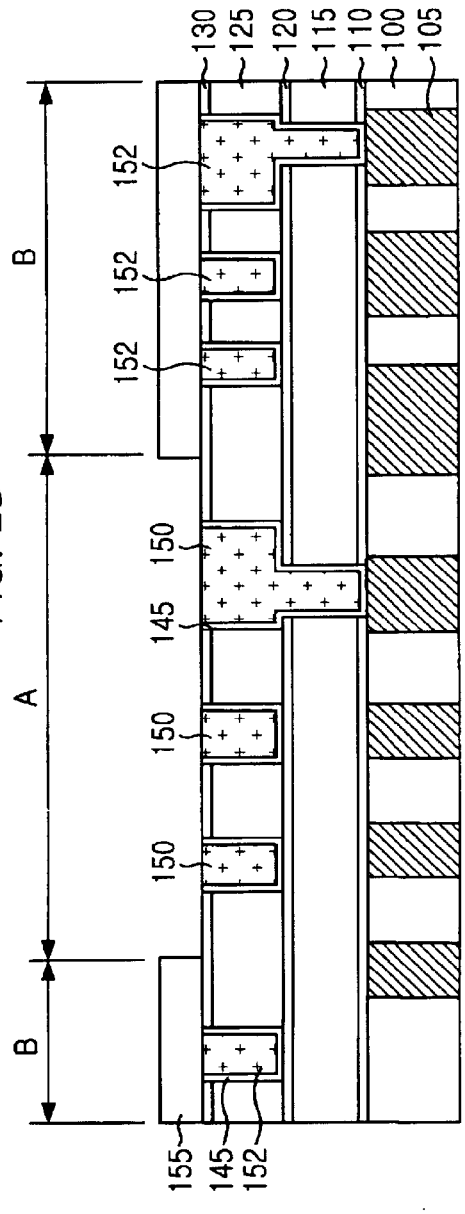

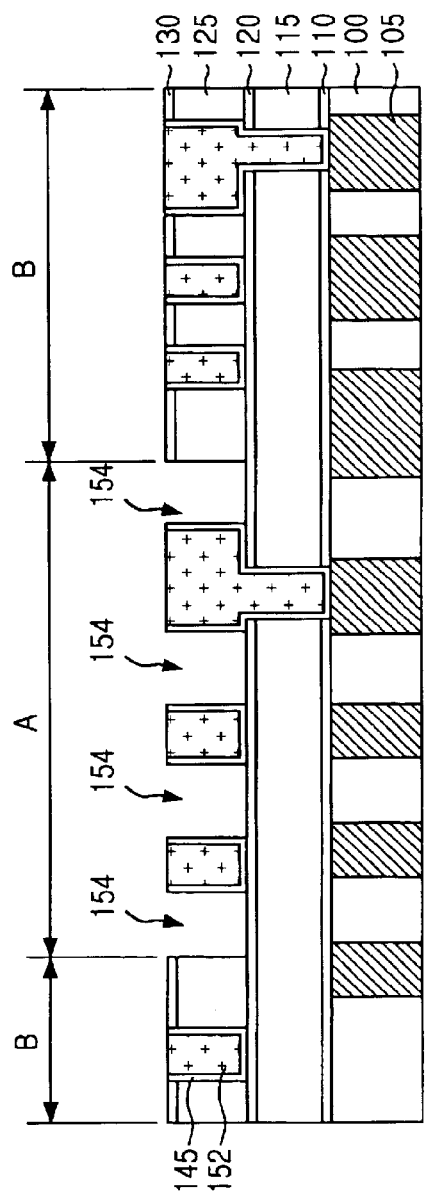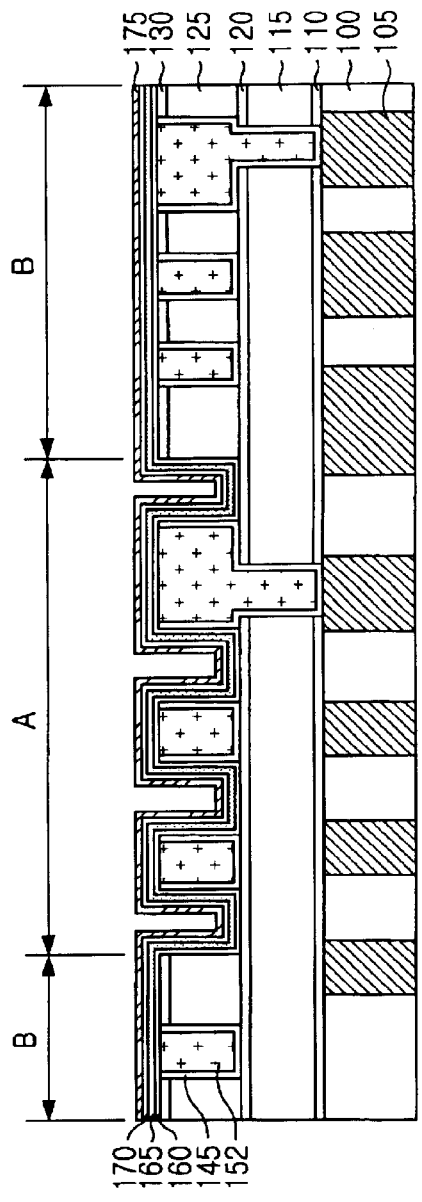

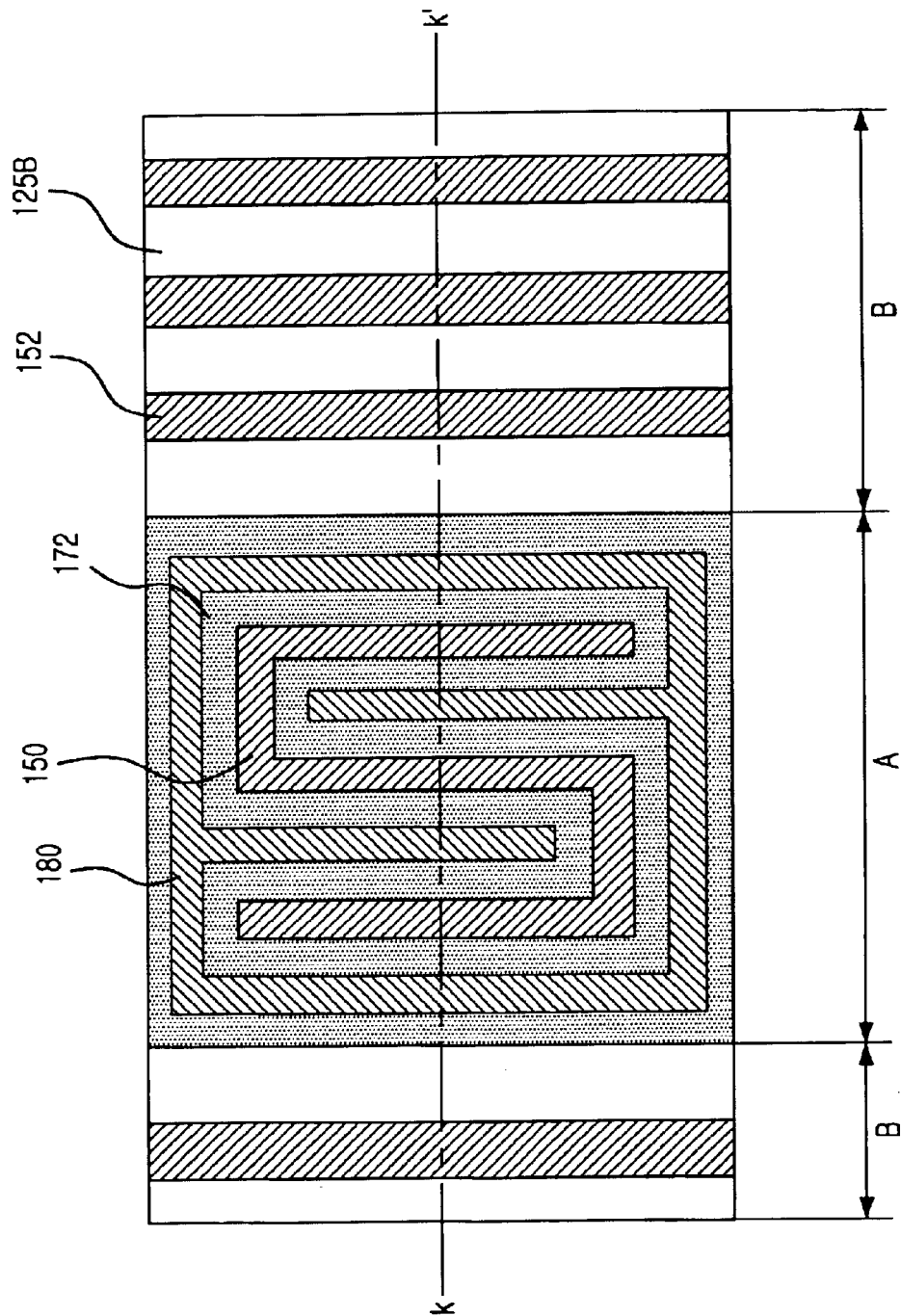

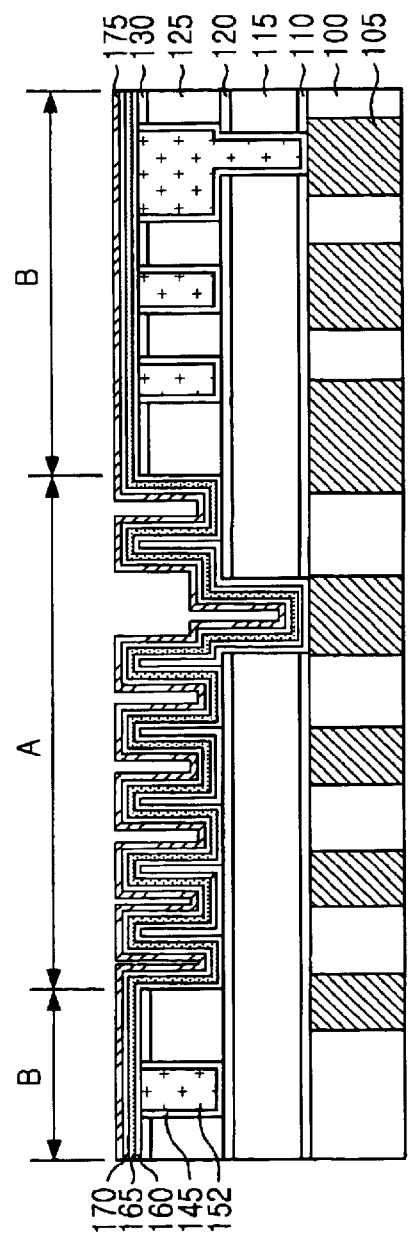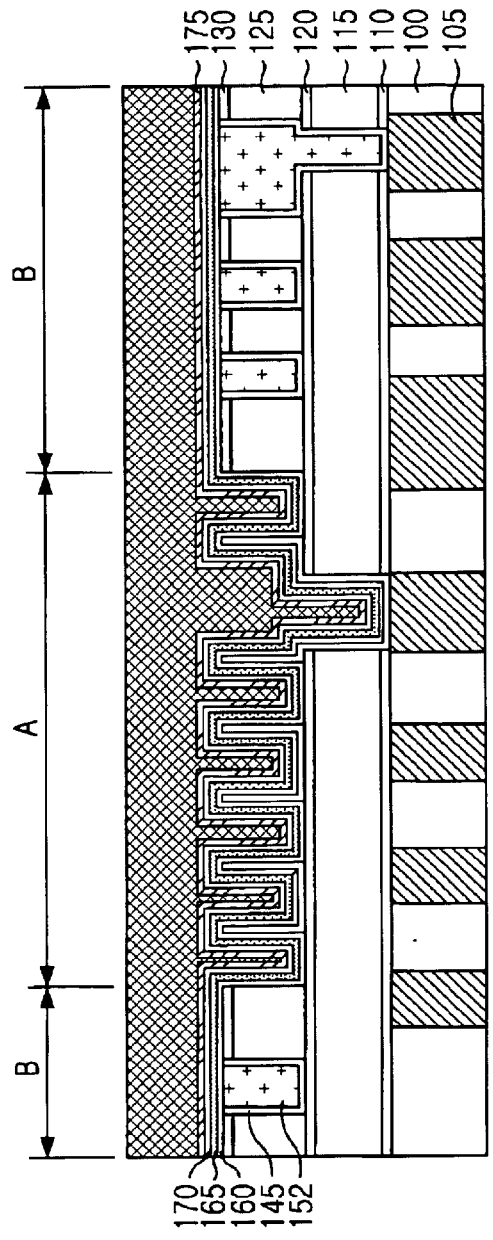

DAMASCENE CAPACITOR FORMED IN METAL INTERCONNECTION LAYER

FIELD OF THE INVENTION

The present invention relates to a method for fabricating a semiconductor device and, more particularly, to a semiconductor device with a capacitor and an interconnection formed by a damascene process.

DESCRIPTION OF RELATED ART

Logic elements become more highly integrated and their processing speed gets faster and faster, as transistors become finer. In response to the integration of transistors, interconnections have become finer and the number of interconnection layers is increasing dramatically. As a result, the problem of interconnection delay caused by miniaturization is intensified in a high-speed and highly integrated device and is a factor that limits the speed of the device.

In this circumstance, a method is needed of forming an interconnection using copper with a lower specific resistance and higher electromigration (EM) property than an aluminum alloy, a material conventionally used for the interconnections of a large scale integration (LSI).

However, since copper is not easily etched in a conventional dry etching method which has been used for forming an aluminum interconnection, and it is easily oxidized during the process, a damascene process is used to form a copper interconnection.

The damascene process is entirely different from the conventional processing series of aluminum deposition, reactive ion etching (RIE) and deposition of insulation material and planarization. That is, the damascene process is a filling process composed of forming an interconnection trench and an access hole on an insulation layer, filling them with copper and then planarizing using a chemical mechanical polishing (CMP) method.

There is a single damascene process which forms an interconnection trench and access plug separately, and a dual damascene process which forms the access plug and interconnection trench concurrently. In the case of the dual damascene process, since the access plug and interconnection trench are formed concurrently, the aspect ratio is higher than with the single damascene process, but the dual damascene process is commonly used in order to lower processing cost.

The dual damascene process consists of a sequence of forming an access hole and an interconnection trench, forming a barrier metal, filling the access hole and interconnection trench with copper, and polishing the copper and the barrier metal using a CMP method.

Meanwhile, a capacitor, a passive element, is formed during the process of the semiconductor device fabrication to form various logic elements. As an example, in a micro processor unit (MPU), a decoupling capacitor is formed; and in a system on a chip (SOC) and a radio frequency (RF) element, a coupling and bypass capacitor is formed for impedance matching between the blocks, while in an analog to digital (AD) converter or a digital to analog (DA) converter, a capacitor array is formed.

To form these capacitors, a junction capacitor using a silicon junction or a metal/insulator/metal (MIM) capacitor of aluminum/silicon nitride layer/aluminum (Al/SiN/Al) that is formed by using a silicon nitride (SiN) layer as a dielectric layer which is deposited in a plasma enhanced chemical vapor deposition (PECVD) method in a conventional aluminum interconnection technology, have been formed so far However, as operational frequency and a number of bits of a converter increase, a capacitor with. higher capacity is needed. For instance, in the case of a central processing unit (CPU) that operates at 1 GHz, 400 nF of capacitor capacity is needed for decoupling. Here, if the thickness (Toxeq) of an effective oxide layer is 1 nm, the capacitor is 34.5 $nF/mm^2$, and an area of 11.6 $mm^2$ is needed for 400 nF. The. dielectric constant of a 1000 ÅSiN layer deposited in a PECVD method is 7, the thickness (Toxeq) of an effective oxide layer is around 56 nm, and as the capacitance is 0.62 $nF/mm^2$, a capacitor with an area of 645 $mm^2$ is needed for 400 nF, which cannot be realized in the conventional manufacturing process of a semiconductor chip.

Consequently, a structure that can increase the capacity of a capacitor without increasing the processing steps and the area of the device is required.

SUMMARY OF THE INVENTION

It is, therefore, an object of the present invention to provide a method for fabricating a semiconductor device that forms a capacitor and a metal interconnection in the same level of a layer by using a damascene process method, and a semiconductor device formed by the method.

In accordance with an embodiment of the present invention, there is provided a method for forming a semiconductor device, including steps of a) forming an insulation layer in a capacitor region and a metal interconnection region on a substrate; b) forming a metal interconnection in the metal interconnection region of the insulation layer by performing a dual damascene process; and c) forming a capacitor in the capacitor region of the insulation layer such that the capacitor is in a same level as the metal interconnection in the insulation layer.

In accordance with another embodiment of the present invention, there is provided a method for fabricating a semiconductor device, comprising steps of a) forming an insulation layer including first and second insulation layers in a capacitor region and a metal interconnection region on a substrate formed with a lower conductive layer; b) forming an interconnection trench in the metal interconnection region, a first trench in the capacitor region and a via hole connected to the lower conductive layer by selectively etching the insulation layer; c) forming a copper interconnection, a first copper interconnection and a via contact plug by, forming a first copper layer in the interconnection trench, the access hole and the first trench and planarizing a resulting structure; d) forming a second trench by selectively etching the second insulation layer in the capacitor region; e) forming a capacitor composed of a first electrode, a dielectric layer and a second electrode on side and bottom surfaces of the second trench; and f) forming a second copper interconnection by forming a second copper layer on the capacitor and planarizing the second cooper layer.

In accordance with yet another embodiment of the present invention, there is provided a method for fabricating a semiconductor device, comprising steps of a) forming an insulation layer including first and second insulation layers in a metal interconnection region and a capacitor region on a substrate formed with a lower conductive layer; b) forming an interconnection trench in the metal interconnection region, a first trench in the capacitor region and a via hole by selectively etching the insulation layer; c) forming a copper interconnection, a via contact plug and a first copper interconnection by forming a first barrier metal and a first copper layer in the interconnection trench, the via hole and the first trench and planarizing a resulting structure; d) forming a second trench by selectively etching the second insulation layer around the first copper interconnection in the capacitor region; e) forming a third trench in the first barrier metal by selectively etching the first copper interconnection; f) forming a capacitor composed of a first electrode, a dielectric layer and a second electrode on side and bottom surfaces of the second and third trenches; and g) forming a second copper interconnection by forming a second copper layer on the capacitor and planarizing the second copper layer.

In accordance with a further embodiment of the present invention, there is provided a semiconductor device, comprising a substrate; an insulation layer formed in a metal interconnection region and a capacitor region on the substrate; a metal interconnection in the insulation layer of the metal interconnection region; and a capacitor formed in the capacitor region of the insulation layer in a same level as the metal interconnection.

The present invention forms a three-dimensional capacitor on a damascene pattern by maintaining the conventional process in a damascene process. That is, it is a method of fabricating a capacitor that can proceed with a damascene interconnection process, and there is no increase in the number of layers.

This invention separates a region for forming a metal interconnection and a region for forming a capacitor by the damascene process, and in a region for the capacitor, a separate procedure is carried out to form the metal interconnection and the capacitor in the same level of a layer.

BRIEF DESCRIPTION OF THE DRAWINGS

The above and other objects and features of the present invention will become apparent from the following description of the preferred embodiments given in conjunction with the accompanying drawings, in which:

FIGS. 2A to 2G are cross-sectional views illustrating a method for forming a semiconductor device in accordance with the first embodiment of the present invention;

FIGS. 3A and 3B are top plan views of FIGS. 1 and 2B, respectively; and

DETAILED DESCRIPTION OF THE INVENTION

Other objects and aspects of the invention will become apparent from the following description of the embodiments with reference to the accompanying drawings, which is set forth hereinafter.

Figure 1:
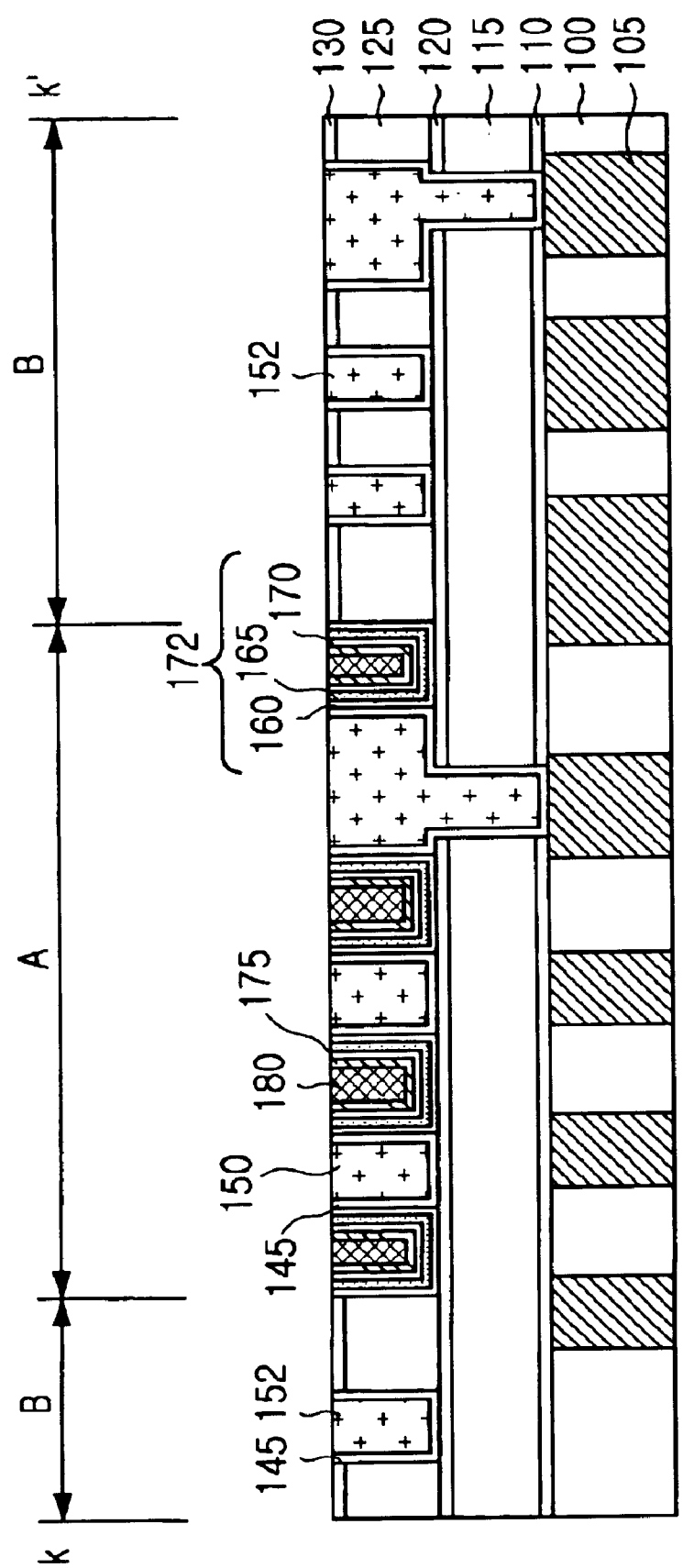
FIG. 1 is a cross-sectional view showing a semiconductor device of the present invention in which a copper interconnection and a capacitor are formed in the same layer in accordance with a first embodiment of the present invention.

FIG. 1 is a cross-sectional view showing a semiconductor device in which copper intersections and a capacitor are formed concurrently in a damascene process in accordance with a first embodiment of the present invention, and FIG. 3A is a top plan view of FIG. 1. FIG. 1 is a schematic cross-sectional view along the line k–k' of the semiconductor device of FIG. 3A. For the simplicity of drawings, some elements show in FIG. 1, such as a first and second barrier metal 145, 175 are not described in FIG. 3A, and some capacitors shown in FIG. 3A are omitted in FIG. 1, especially in the region A.

In the drawing, there are a lower insulation layer 100 and a lower interconnection 105, and on top of them, a copper anti-diffusion insulation layer 110, a first insulation layer 115 formed with via holes, an etching blocking layer 120, a second insulation layer 125 and a hard mask layer 130 are deposited.

Within the second insulation layer 125, a capacitor in a winding shape and a metal interconnection are formed in the capacitor region A, and the metal interconnection region B of the same layer, respectively, of the same layer by a damascene process.

As illustrated in FIG. 1, the capacitor region A includes a first copper interconnection 150, a capacitor 172 having a first electrode 160, a dielectric layer 165, and a second electrode 170, formed on the side and bottom surfaces of a trench formed between the first copper interconnection 150, and a second copper interconnection 180 connected to the second electrode 170. Preferably, a first barrier metal 145 is formed between the first electrode 160 and the first copper interconnection 150, and a second barrier metal 175 is formed between the second electrode 170 and the second copper interconnection 180.

The metal interconnection region B is formed by a conventional dual damascene process, as described in FIG. 1, and there is a metal interconnection 152 formed between the second inter-layer dielectric layer 125.

To describe the plane figure of a capacitor in the capacitor region A with reference to FIG. 3A, a capacitor 172 having a first electrode, a dielectric layer, and a second electrode is formed between the winding-shaped first copper interconnection 150 and the second copper interconnection 180. The capacitor 172 is formed of a first electrode 160, a dielectric layer 165 and a second electrode 170 deposited in sequence, although they are not illustrated in FIG. 3A. Also, although not illustrated, first and second barrier metals are formed between the capacitor and the first and the second copper interconnections.

In the metal interconnection region B, the copper interconnection 152 formed by the damascene process is disposed at regular intervals with an insulation layer 125B. In the plane figure of FIG. 3A, a via contact connected between the lines of the copper interconnection is not illustrated. The first and second insulation layers 115, 125 are selected from the group of $SiO_2$, SiOC, SiOH, SiOCH and insulation layers with low dielectric constants below 3.0. It is known that insulation layers with low dielectric constants decrease the parasitic capacitance between the lines of the copper interconnection and reduce interconnection resistance along the copper interconnection, thereby increasing the speed of the device and reducing device cross talk. Various insulation layers with low dielectric constants are under development, and largely they are classified into two groups: a $SiO_2$ group (Si—O group) and a carbon group (C group). The $SiO_2$ group includes fluorine-doped silicate glass (FSG), hydrogen silsesquioxane (HSQ), inorganic spin on glass (SOG), organic SOG, etc, while the carbon group polymers are classified according to the presence of fluorine (F).

The anti-diffusion insulation layer 110, etching blocking layer 120 and hard mask layer 130 use SiN, SiC and SiCN layers at a thickness of 100 Å to 1000 Å. Here, the etching blocking layer 120 and the hard mask layer 130 can be omitted according to a dual damascene patterning method and the kind of layers used. Also, the hard mask layer 130 can be formed as a dual top hard mask.

The barrier metals 145, 175 are selected from the group of Ta, TaN, TiN, WN, TaC, WC, TiSiN and TaSiN, and combinations thereof.

The dielectric layer 165 of the capacitor is selected from the group of Ta oxides, Ba—Sr—Ti oxides, Zr oxides, Hf oxides, Pb—Zn—Ti oxides and Sr—Bi—Ta oxides, and combinations thereof.

As the first and second electrodes 160, 170 of the capacitor, a metal such as Pt, Ru, Ir and W may be used. Preferably, when forming a lower electrode conductive layer, a lower electrode conductive layer is deposited after an adhesive layer of TiN, TiAlN and TiSiN is formed to enhance the adhesiveness of the insulation layer in the lower part.

Copper damascene has been described in the above embodiment, but the interconnections and capacitors can be formed on an oxide metal or a conductive compound of conductive metals other than copper.

FIGS. 2A to 2G show a method for forming the structure of FIG. 1.

Figure 2A:
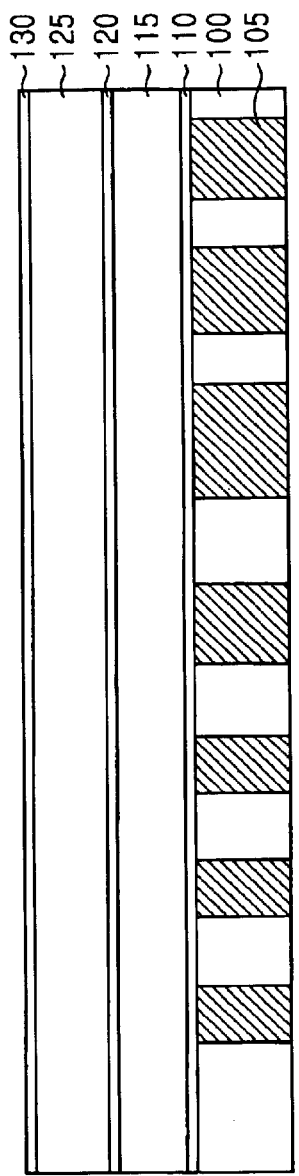

FIG. 2A is a cross-sectional view showing a method of forming a series of insulation layers on the lower insulation layer 100 in which a lower interconnection 105 is formed in accordance with the present invention.

There is a lower insulation layer 100 and a lower interconnection 105, and on top of them, a copper anti-diffusion insulation layer 110, a first insulation layer 115, an etching blocking layer 120, a second insulation layer 125 and a hard mask layer 130 are deposited in sequence. Within first insulation layer 115, a via connecting upper and lower copper interconnections is to be formed later, while the second insulation layer 125 is the layer in which a copper interconnection and a capacitor are formed.

The first insulation layer 115 and the second insulation layer 125 use at least one selected from the group of $SiO_2$, SiOC, SiOH, SiOCH and insulation layers with low dielectric constants below 3.0. As a deposition method, a plasma enhanced chemical vapor deposition (PECVD), high density plasma CVD (HDP-CVD), atmospheric pressure CVD (APCVD), or spin coating method is used.

To form the copper anti-diffusion layer 110, the etching blocking layer 120 and the hard mask layer 130, a SiN, SiC, or SiCN layer deposited in the PECVD method is used at a thickness of 100 Å to 1000 Å.

Figure 2B:
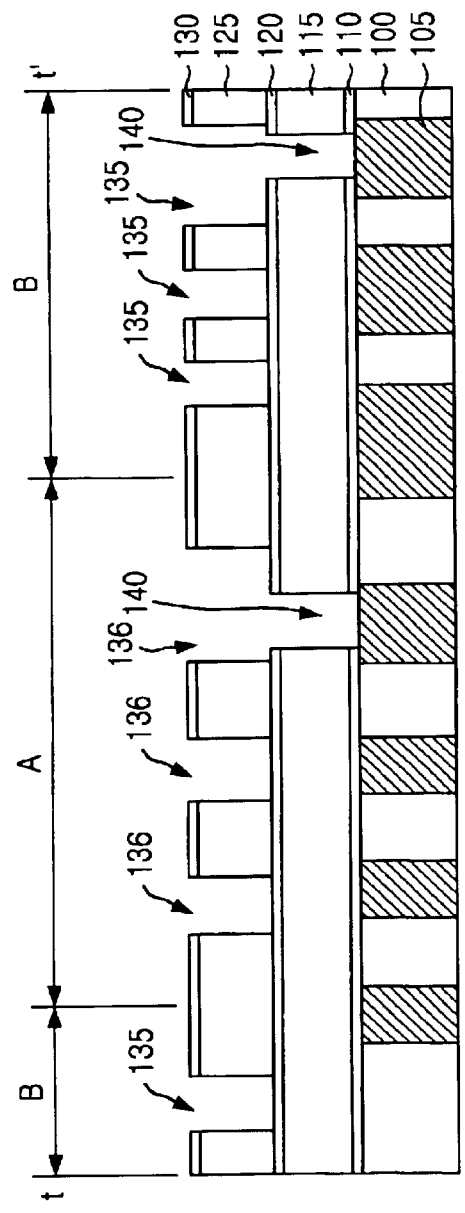

FIG. 2B is a cross-sectional view illustrating a method for forming an interconnection trench 135, a winding-shaped first trench 136 and a via hole 140. According to the dual damascene method, a via hole 140 may be formed first prior to an interconnection trench, or the interconnection trench may be formed first prior to the via hole.

The interconnection trench 135 and the first trench 136 are formed in the same layer concurrently, but their roles are different. That is, a copper interconnection is to be formed later in the interconnection trench 135, while a first copper interconnection to be connected to an electrode of a capacitor is formed in the first trench 136 in the same insulation layer.

Figure 3B:
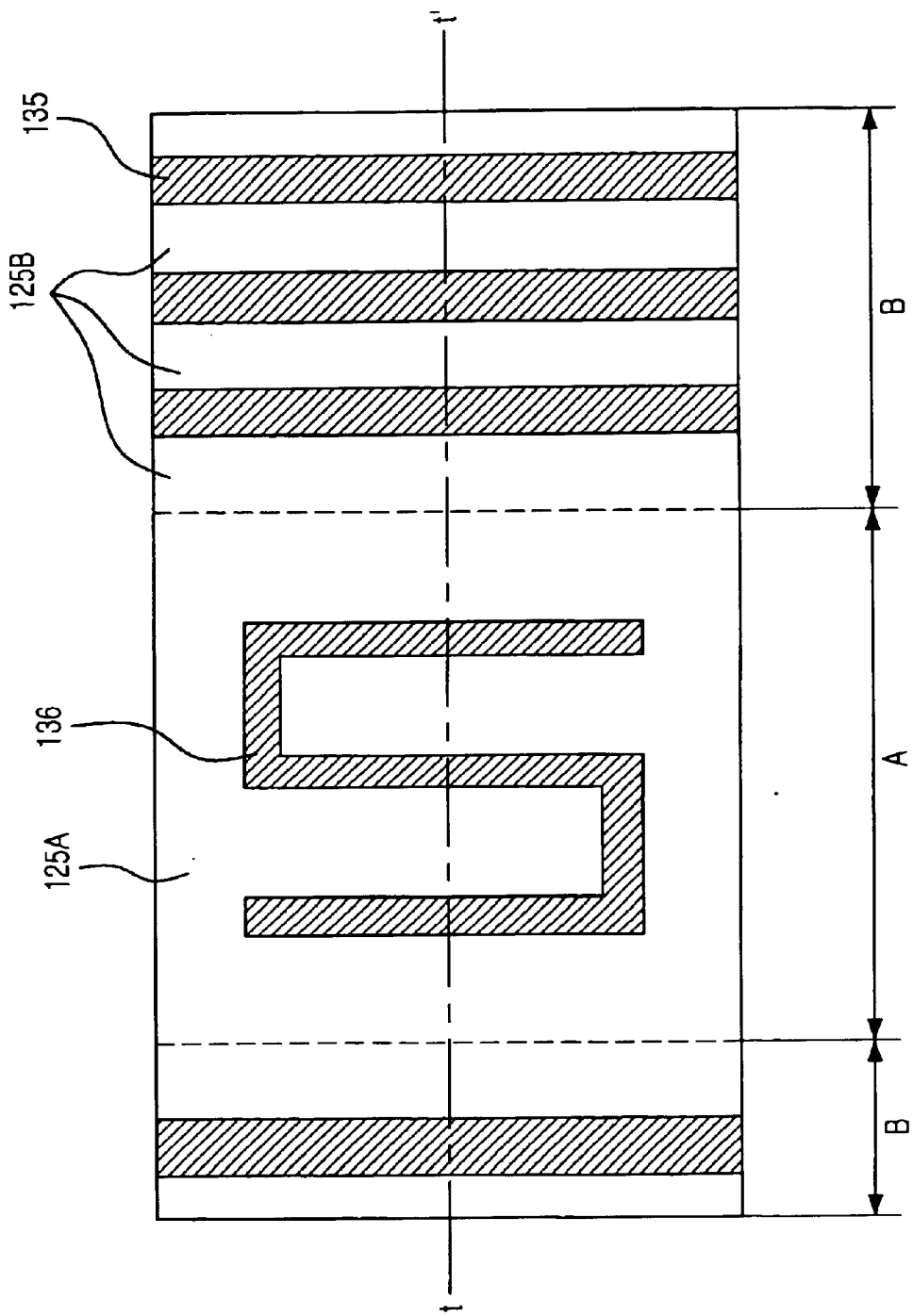

FIG. 3B is a top plan figure and FIG. 2B is a cross-sectional view of a semiconductor device of FIG. 3B cut out along the line t–t'. In the metal interconnection region B, the interconnection trench 135, where the copper interconnection will later be formed, is a line located in a predetermined gap between the second insulation layers 125B, but is connected planarily to the first trench 136, where a winding-shaped first copper interconnection to be connected to an electrode of a capacitor is to be formed in the capacitor region A. The insulation layer is divided into a capacitor region insulation layer 125 A and a metal interconnection region insulation layer 125B, for convenience. The winding shape can be transformed into various shapes other than the structure shown in FIG. 3B.

FIG. 2C is a cross-sectional view showing a metal interconnection 152 and a first copper interconnection 150 by a damascene process in accordance with the present invention.

First, a first barrier metal 145 is formed on the entire surface of a substrate formed with the interconnection trench 135, winding-shaped first trench 136 and via hole 140. The first barrier metal 145 is used to prevent deterioration in the electrical property of the capacitor and in the insulation property of an inter-layer dielectric layer by the diffusion of a copper conductive material formed later on. The first barrier metal is selected from the group of Ta, TaN, TiN, WN, TaC, WC, TiSiN and TaSiN and combinations thereof as its material. As a deposition method, a physical vapor deposition (PVD), a chemical vapor deposition (CVD) or an atomic layer deposition (ALD) method is used.

Preferably, a cleansing procedure is performed to improve the quality of the interface between the lower interconnection and the bottom of the access opening, and the interface between the metal surface and the inter-layer dielectric layer before the deposition of the first barrier metal 145 to make resistance low. This is because when copper oxide remains at the bottom of resistance is increased and also the copper in the oxide layer is diffused when it remains in the inter-layer dielectric layer. The cleaning step includes the steps of loading a wafer in the deposition equipment; performing degas in a high pressure vacuum condition; and performing an Ar sputter cleaning or a reactive cleaning using a plasma containing hydrogen such as $H_2$, $NH_3$, etc.

Subsequently, a first copper layer is formed on the substrate. Here, the first copper layer is formed to fill up the interconnection trench 135, the first trench 136 and the via hole 140. The first copper layer is formed in the reflow method after forming the layer using the sputtering method, the CVD method or an electroplating method.

When using the electroplating method, a seed layer needs to be formed on top of the first barrier metal 145 to flow a current during electrolysis. That is, the first copper conductive layer can be formed by the electroplating method after forming a copper seed layer in the PVD or CVD method, after forming a seed layer in an electroless deposition or a combination thereof.

After the formation of the first conductive layer, the first copper conductive layer and the first barrier metal on the insulation layer are removed by planarization: until the insulation layer is exposed using the CMP. Accordingly, in the capacitor region A, a winding-shaped first copper interconnection 150 is formed, and in the metal interconnection region B, a metal interconnection 152 is formed.

FIG. 2D is a cross-sectional view of a method whereby a photoresist pattern 155 is formed to expose the capacitor region A in accordance with the present invention. The exposed region is a capacitor region A where the winding-shaped capacitor is to be formed; the metal interconnection region B is not exposed.

FIG. 2E is a cross-sectional view showing a method of forming a winding-shaped, second trench 154 by selectively etching the second insulation layer 125 of the capacitor region A in accordance with the present invention.

The winding-shaped second trench 154 where a capacitor is to be formed later is formed by selectively etching the second insulation layer 125 of the capacitor region A, using the photoresist pattern 155 formed above. With reference to FIG. 3B, the capacitor region insulation layer 125A is removed and a winding-shaped second trench 154 is formed thereon.

If a hard mask layer 130 is used on top of the second insulation layer 125, the hard mask layer 130 is removed by performing a plasma dry etching with a gas including fluorine (F).

Subsequently, if the second insulation layer 125 is formed of $SiO_2$, FSG, SiOC, SiOH or SiOCH, the second insulation layer 125 is removed by using a solution containing HF. If the second insulation layer 125 is a low-k insulation layer formed of a polymer, the second insulation layer 125 is removed by using $O_2$ plasma. While the second insulation layer is etched, the first insulation layer 115 is not damaged because there is an etching blocking layer 120 overlying the first insulation layer 115.

FIG. 2F is a cross-sectional view showing a layer to form: a capacitor and a second barrier metal in accordance with the present-invention. On the entire surface of the substrate, a first electrode 160, a dielectric layer 165 and a second electrode 170 are formed in sequence, and then a second barrier metal 175 is formed thereon.

When forming the first and second electrodes 160, 170, a metal such as Pt, Ru, Ir and W is used, and as for a deposition method, the CVD, PVD or ALD method is used. Preferably, when the lower electrode conductive layer is formed, an adhesive layer of TiN, TiAlN, TiSiN, etc., is formed for good adherence with the lower insulation layer and then the first electrode 160 is deposited.

As for the dielectric layer 165 of the capacitor, Ta oxide, Ba—Sr—Ti oxide, Zr oxide, Hf oxide, Pb—Zn—Ti oxide or Sr—Bi—Ta oxide is used. As for a deposition method, the CVD, PVD or ALD method is used.

The second barrier metal 175 is used to prevent deterioration in the electrical property of the capacitor and in the insulation property of an inter-layer insulation layer. Before the deposition of the second barrier metal 175, a wafer is loaded in the deposition equipment. Degas process is performed in a high pressure vacuum condition; and an Ar sputter cleaning or a reactive cleaning using a plasma containing hydrogen such as $H_2$, $NH_3$, etc is used. The material and cleaning method of the second barrier metal is the same as those used for the first barrier metal described above.

Figure 2G:
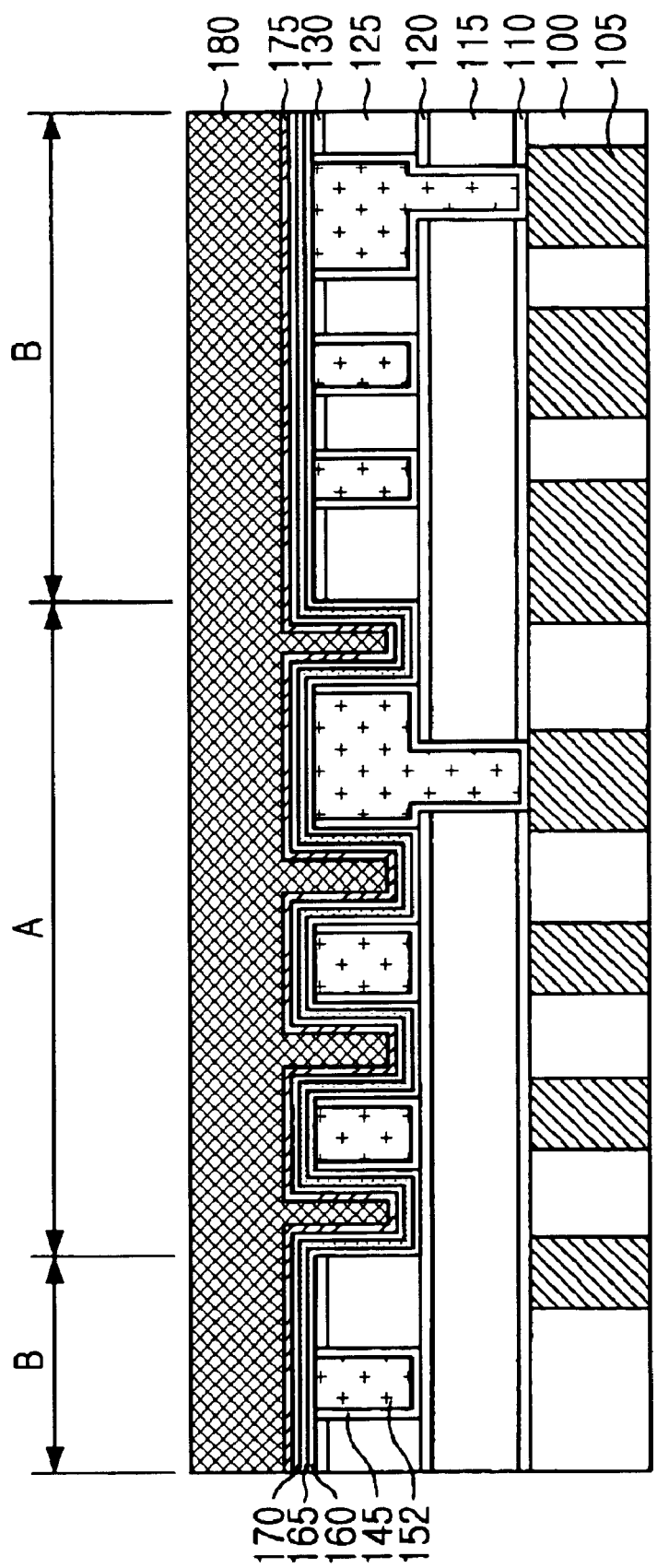

FIG. 2G is a cross-sectional view illustrating formation of a second copper layer in accordance with the present invention. On the entire surface of the substrate, a second copper layer 180 is formed. Here, the second copper layer 180 fills up the substrate entirely. The method of forming the second copper layer 180 is the same as that used with the first copper layer described above.

Subsequently, when the second copper layer 180 is planarized, it becomes a semiconductor device formed with a capacitor and a copper interconnection as shown in FIGS. 1 and 3A. The planarization proceeds until the first copper interconnection 150 and the metal interconnection 152 are exposed by using the CMP. That is, a capacitor whose side and bottom surfaces become the effective area of the capacitor is formed in the capacitor region A and the copper interconnection is formed in the metal interconnection region B by removing the second copper layer, the second barrier metal, the first electrode, the dielectric layer and the second electrode on top of the first copper interconnection 150 and the metal interconnection 152.

Subsequently, after the procedures of forming the capacitor and the metal interconnection, the inter-layer dielectric layers of a sequence of a copper anti-diffusion insulation layer, a second insulation layer, an etching blocking layer, a third insulation layer and a hard mask layer are deposited in sequence to form another multi-layer interconnection as illustrated in FIG. 1. After that, a via hole, an interconnection trench or, if necessary, a winding-shaped trench is formed and the multi-layer interconnection process proceeds.

Hereinafter, a second embodiment of the present invention will be describe referring to FIGS. 2A to 2E and FIGS. 4A to 4C.

As shown in FIG. 2A, a series of insulation layer including a copper anti-diffusion layer 110, a first insulation layer 115, an etching blocking layer 120, a second insulation layer 125 and a hard mask layer 130 are formed on the lower insulation layer 100 having a copper lower interconnection 105 therein.

And then an interconnection trench 134, a winding-shaped first trench 136 and a via hole 140 are formed as shown in FIG. 2B.

Subsequently, a first barrier metal 145 and a metal interconnection 150 in the first trench and via contact plug are formed.

Thereafter, as shown in FIG. 2E, a winding-shaped second trench 154 is formed in the capacitor region A by removing the insulation layer, selectively.

The subsequent processes are different from the first embodiment.

Figure 4A:
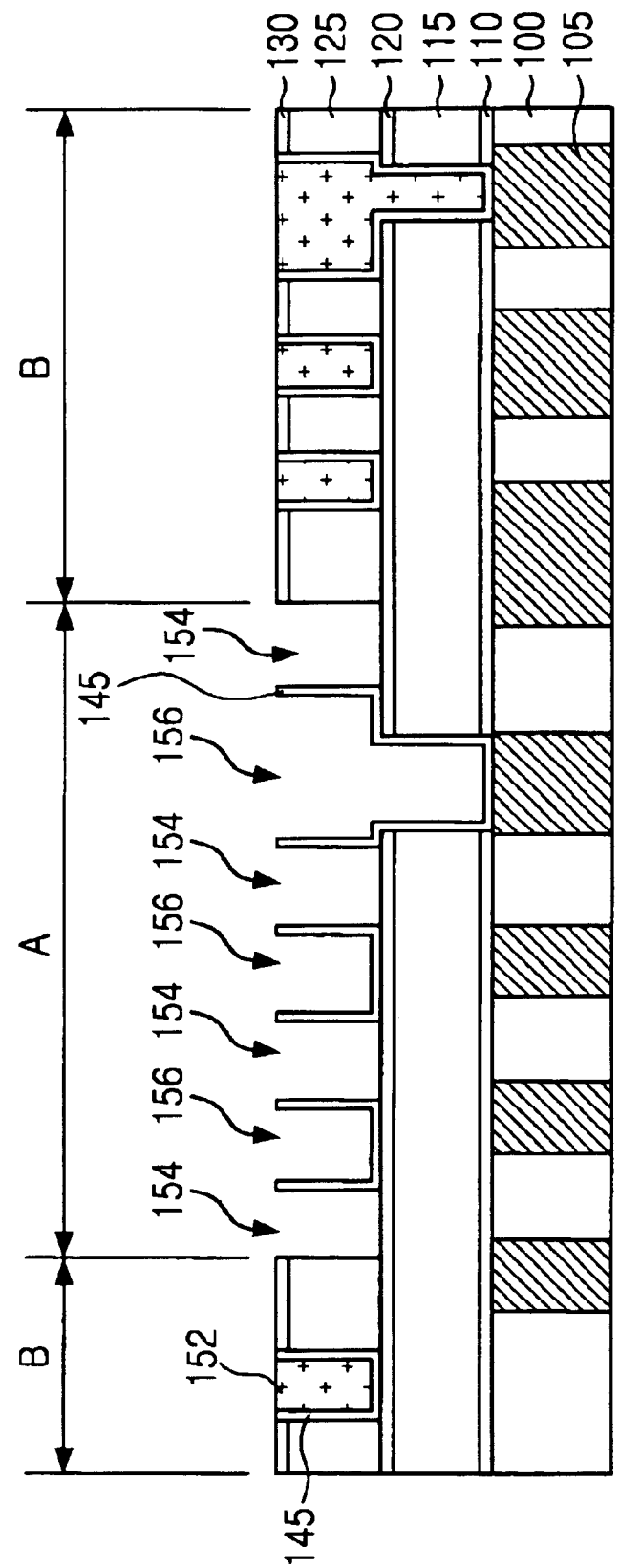
FIG. 4 is a cross-sectional view showing a method for forming a semiconductor device in accordance with a second embodiment of the present invention.

Referring to FIG. 4A, a second trench 154 is formed by removing the second insulation layer 125, and a winding-shaped third trench 156 is formed by removing the first copper interconnection covering the first barrier metal, in the capacitor region A. Since the first copper interconnection needs to be etched in the capacitor region A only, a photo process is performed so that the copper interconnection in the metal interconnection region B is not damaged. A three-dimensional structure of the first barrier metal 145 is formed by removing the second insulation layer and the first copper interconnection, as shown in FIG. 4A. Then, HCl or $H_2SO_4$ acid, solution is used to etch the first copper interconnection only without damaging the first barrier metal.

Thereafter, as shown in FIG. 4B, a first electrode 160, a dielectric layer 165 and a second electrode 170 are formed to form a capacitor. Subsequently, a second barrier metal 175 is deposited, and after the deposition of a second copper conductive layer, a capacitor is formed in the same layer as the copper interconnection by performing the CMP.

Subsequently, a second copper interconnection 180 is formed as shown in FIG. 4C.

Therefore, the second embodiment proceeds using the same processing as shown in FIGS. 2A to 2E of the first embodiment, with the addition of the process of FIG. 4A that removes the first copper conductive layer in HCl or $H_2SO_4$ acid solution.

In the second embodiment, a first barrier metal is formed in a winding shape, and the second copper interconnection and the capacitor are formed at what is supposed to be a part for an insulation layer and a part for the first copper interconnection conventionally. That is, with the first barrier metal in the center, a capacitor composed of a first electrode on both sides and at the bottom, a dielectric layer, a second electrode, a second barrier metal and a second copper interconnection is formed.

In other words, the semiconductor including the capacitor comprises a barrier metal with a winding-shaped first trench (the winding-shaped third trench) inside; a second trench (a winding-shaped second trench) formed between the barrier metal; and a capacitor formed with a first electrode, a dielectric layer and a second electrode on the side and the bottom surfaces of the first and the second trenches.

Compared to the first embodiment, the second embodiment has an advantage in that the capacitor area is further increased.

The above embodiment describes a copper damascene process, but the same interconnection process can be performed in conductive metal, oxide metal or conductive compounds other than copper, and the same capacitor can be formed.

The present invention described above forms a capacitor without increasing the number of processing steps by fabricating a capacitor in the same layer as the metal interconnection, maintaining the damascene process for forming a conventional interconnection. Also, the structure of the capacitor can be embodied easily by the damascene process, thus obtaining a capacitor structure of high capacity which is needed for logic elements.

While the present invention has been described with respect to certain preferred embodiments, it will be apparent to those skilled in the art that various changes and modifications may be made without departing from the scope of the invention as defined in the following claims.

What is claimed is:

1. A semiconductor device, comprising:
   a substrate;
   an insulation layer formed in a metal interconnection region and a capacitor region on the substrate;
   a barrier metal layer formed on the insulating layer;
   a metal interconnection formed on the barrier metal layer in the insulation layer of the metal interconnection region; and
   a capacitor formed on the barrier metal layer in the capacitor region of the insulation layer in a same level as the metal interconnection.

2. The semiconductor device as recited in claim 1, wherein the capacitor region includes:
   a first metal interconnection;
   a trench formed between parts of the first metal interconnection; and
   a capacitor composed of a first electrode, a dielectric layer and a second electrode on side and bottom surfaces of the trench.

3. The semiconductor device as recited in claim 1, wherein the capacitor region includes:
   a first trench inside of which said barrier metal is deposited;
   a second trench formed between portions of the barrier metal; and
   a capacitor composed of a first electrode, a dielectric layer and a second electrode on side and bottom surfaces of the first and second trenches.

4. The semiconductor device as recited in claim 2, further including a second metal interconnection connected to the second electrode of the capacitor.

5. The semiconductor device as recited in claim 4, wherein the first and the second metal interconnections are formed by depositing a copper layer a on said barrier metal layer.

6. The semiconductor device as recited in claim 1, wherein the insulation layer is made of a material selected from the group consisting of $SiO_2$, SiOC, SiOH, SiOCH, insulation layers with dielectric constants below 3.0, and combinations thereof.

7. The semiconductor device as recited in claim 2, wherein the dielectric layer is made of an oxide selected from the group consisting of Ta oxide, Ba—Sr—Ti oxide, Zr oxide, Hf oxide, Pb—Zn—Ti oxide, Sr—Bi—Ta oxide, and combinations thereof.

8. The semiconductor device as recited in claim 2, wherein the first and the second electrodes are made of a metal selected from the group consisting of Pt, Ru, Ir and W.

9. The semiconductor device as recited in claim 5, wherein the barrier metal is made of a material selected from the group consisting of Ta, TaN, TiN, WN, TaC, WC, TiSiN, TaSiN, and combinations thereof.

10. A semiconductor device, comprising:
    a substrate;
    an insulation layer formed in a metal interconnection region and a capacitor region on the substrate;
    a metal interconnection in the insulation layer of the metal interconnection region; and
    a capacitor formed in the capacitor region of the insulation layer in a same level as the metal interconnection, said capacitor including a first metal interconnection and a second metal interconnection, said first and second metal interconnections being formed by depositing a copper layer and a barrier metal.

11. The semiconductor device as recited in claim 10, wherein the barrier metal is made of a material selected from the group consisting of Ta, TaN, TiN, WN, TaC, WC, TiSiN, TaSiN, and combinations thereof.

12. A semiconductor device, comprising:
    a substrate;
    an insulation layer formed in a metal interconnection region and a capacitor region on the substrate, said insulation layer being made of a material with a dielectric constant below 3.0;
    a metal interconnection in the insulation layer of the metal interconnection region; and
    a capacitor formed in the capacitor region of the insulation layer in a same level as the metal interconnection.

13. The semiconductor device as recited in claim 12, wherein the material of said insulation layer is selected from the group consisting of $SiO_2$, SiOC, SiOH, SiOCH, insulation layers, and combinations thereof.

14. A semiconductor device, comprising:
    a substrate;
    an insulation layer formed in a metal interconnection region and a capacitor region on the substrate;
    a metal interconnection in the insulation layer of the metal interconnection region; and
    a capacitor formed in the capacitor region of the insulation layer in a same level as the metal interconnection, said capacitor including a first metal interconnection, a trench formed between parts of the first metal interconnection, and a capacitor composed of a first electrode, a dielectric layer and a second electrode on side and bottom surfaces of the trench, said dielectric layer being made of an oxide selected from the group consisting of Ta oxide, Ba—Sr—Ti oxide, Zr oxide, Hf oxide, Pb—Zn—Ti oxide, Sr—Bi—Ta oxide, and combinations thereof.

15. A semiconductor device, comprising:

a substrate;

an insulation layer formed in a metal interconnection region and a capacitor region on the substrate;

a metal interconnection in the insulation layer of the metal interconnection region; and a capacitor formed in the capacitor region of the insulation layer in a same level as the metal interconnection, said capacitor including a first metal interconnection, a trench formed between parts of the first metal interconnection, and a capacitor composed of a first electrode, a dielectric layer and a second electrode on side and bottom surfaces of the trench, said first and second electrodes being made of a metal selected from the group consisting of Pt, Ru, Ir and W.

* * * * *